US012813047B2

(12) United States Patent
So et al.

(10) Patent No.: US 12,813,047 B2
(45) Date of Patent: Nov. 24, 2026

(54) DISPLAY DEVICE AND METHOD OF MANUFACTURING THE SAME

(71) Applicant: Samsung Display Co., LTD., Yongin-si (KR)

(72) Inventors: Myeong Su So, Yongin-si (KR); Tae Jin Kong, Yongin-si (KR); Myeong Hee Kim, Yongin-si (KR); Seul Ki Kim, Yongin-si (KR); Ji Eun Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 403 days.

(21) Appl. No.: 18/340,532

(22) Filed: Jun. 23, 2023

(65) Prior Publication Data

US 2024/0204153 A1 Jun. 20, 2024

(30) Foreign Application Priority Data

Dec. 16, 2022 (KR) ........................ 10-2022-0177268

(51) Int. Cl.

| | |
|---|---|
| ***H01L 33/62*** | (2010.01) |
| ***H10H 20/831*** | (2025.01) |
| ***H10H 20/832*** | (2025.01) |
| ***H10H 20/857*** | (2025.01) |
| ***H10W 90/00*** | (2026.01) |
| *H10H 20/01* | (2025.01) |

(52) U.S. Cl.

CPC ...... *H10H 20/857* (2025.01); *H10H 20/8312* (2025.01); *H10H 20/832* (2025.01); *H10W 90/00* (2026.01); *H10H 20/032* (2025.01); *H10H 20/0364* (2025.01)

(58) Field of Classification Search

CPC ............. H10H 20/857; H10H 20/8312; H10H 20/832; H10H 20/032; H10H 20/0364; H10H 20/01; H10H 20/018; H10H 29/142; H10H 20/83; H10H 20/84; H10H 20/85; H10H 20/0362; H10H 20/8314; H10H 20/833; H10H 20/841; G09F 9/33; H10D 86/40; H10D 86/60; H10D 86/441

See application file for complete search history.

(56) References Cited

U.S. PATENT DOCUMENTS 9,406,656 B2 8/2016 Lee et al.
11,024,773 B2 6/2021 Zou et al.
(Continued)

FOREIGN PATENT DOCUMENTS

KR 20160050420 A 5/2016
KR 10-2030323 10/2019
KR 10-2020-0079817 7/2020

*Primary Examiner* — Elmito Breval

(74) *Attorney, Agent, or Firm* — CANTOR COLBURN LLP

(57) ABSTRACT

A display device includes a pixel circuit layer including a base layer and a pixel circuit, a first electrode disposed on the pixel circuit layer, light emitting elements disposed on the first electrode, a second electrode disposed on the light emitting elements, a first organic layer disposed between the light emitting elements, a second organic layer disposed between the light emitting elements and spaced apart from the light emitting elements, and a contact layer disposed between the first organic layer and the second organic layer and contacting a side surface of the light emitting elements.

9 Claims, 14 Drawing Sheets

(56) References Cited

U.S. PATENT DOCUMENTS

| | | | |
|---|---|---|---|
| 11,094,867 | B2 | 8/2021 | Kang |
| 2016/0126224 | A1* | 5/2016 | Lee ..................... H01L 25/0753 257/89 |
| 2019/0334060 | A1 | 10/2019 | Zou et al. |
| 2020/0212267 | A1 | 7/2020 | Kwak et al. |

* cited by examiner

LE: SCL1, AL, SCL2, EL, RFL, CEL, IL

⊖: TE

LE: SCL1, AL, SCL2, EL, RFL, CEL, IL

⊖: TE

DISPLAY DEVICE AND METHOD OF MANUFACTURING THE SAME

CROSS REFERENCE TO RELATED APPLICATION(S)

This application claims priority to and benefits of Korean Patent Application No. 10-2022-0177268 under 35 U.S.C. § 119, filed on Dec. 16, 2022, in the Korean Intellectual Property Office, the entire content of which are incorporated herein by reference.

BACKGROUND

1. Technical Field

Embodiments relate to a display device and a method of manufacturing the display device.

2. Description of the Related Art

Recently, as interest in information display increases, research and development on a display device has continuously been conducted.

SUMMARY

Embodiments provide a display device and a method of manufacturing the display device capable of efficiently providing an electron to an active layer by preventing a trap of the electron due to a defect in a sidewall of light emitting elements.

However, embodiments of the disclosure are not limited to those set forth herein. The above and other embodiments will become more apparent to one of ordinary skill in the art to which the disclosure pertains by referencing the detailed description of the disclosure given below.

In accordance with an aspect of the invention, a display device may include: a pixel circuit layer including a base layer and a pixel circuit, a first electrode disposed on the pixel circuit layer, light emitting elements disposed on the first electrode, a second electrode disposed on the light emitting elements, a first organic layer disposed between the light emitting elements, a second organic layer disposed between the light emitting elements and spaced apart from the light emitting elements, and a contact layer disposed between the first organic layer and the second organic layer and contacting a side surface of the light emitting elements.

The contact layer may extend along the side surface of the light emitting elements to contact the second electrode.

The second electrode may include a light transmissive material, and the contact layer may include a light reflective material.

Each of the light emitting elements may include a first semiconductor layer including a semiconductor of a first type, a second semiconductor layer including a semiconductor of a second type different from the first type, an active layer disposed between the first semiconductor layer and the second semiconductor layer, an electrode layer disposed on the second semiconductor layer, a reflective layer disposed on the electrode layer, a connection electrode layer disposed on the reflective layer and contacting the first electrode, and an insulating layer covering a side surface of the first semiconductor layer.

The first organic layer may have a thickness to cover a side surface of the active layer.

The second organic layer may have a thickness to cover the side surface of the first semiconductor layer.

According to an embodiment of the disclosure, a display device may include a pixel circuit layer including a base layer and a pixel circuit, a first electrode disposed on the pixel circuit layer, light emitting elements disposed on the first electrode, a first organic layer disposed between the light emitting elements, a second organic layer disposed between the light emitting elements and spaced apart from the light emitting elements, and a second electrode disposed on the light emitting elements, disposed between the first organic layer and the second organic layer, and contacting a side surface of the light emitting elements.

The second electrode may extend along the side surface of the light emitting elements.

The second electrode may include a light transmissive material.

In accordance with an aspect of the invention, a method of manufacturing a display device may include: transferring light emitting elements onto a first electrode on a pixel circuit layer including a base layer and a pixel circuit, forming a first organic layer between the light emitting elements, forming a contact layer on a side surface of the light emitting elements and on the first organic layer, forming a second organic layer on the contact layer, the second organic layer spaced apart from the light emitting elements, etching the contact layer and the second organic layer, and forming a second electrode on the light emitting elements.

The contact layer may extend along the side surface of the light emitting elements to contact the second electrode.

The second electrode may include a light transmissive material, and the contact layer may include a light reflective material.

Each of the light emitting elements may include a first semiconductor layer including a semiconductor of a first type, a second semiconductor layer including a semiconductor of a second type different from the first type, an active layer disposed between the first semiconductor layer and the second semiconductor layer, an electrode layer disposed on the second semiconductor layer, a reflective layer disposed on the electrode layer, a connection electrode layer disposed on the reflective layer and contacting the first electrode, and an insulating layer covering a side surface of the first semiconductor layer.

The first organic layer may have a thickness to cover a side surface of the active layer.

The second organic layer may have a thickness to cover a side surface of the first semiconductor layer.

The etching of the contact layer and the second organic layer may be performed to expose an upper surface of the light emitting elements.

In accordance with an aspect of the invention, a method of manufacturing a display device may include: transferring light emitting elements onto a first electrode on a pixel circuit layer including a base layer and a pixel circuit, forming a first organic layer between the light emitting elements, forming a second electrode on the first organic layer, the second electrode contacting a side surface of the light emitting elements, and forming a second organic layer on the second electrode, the second organic layer spaced apart from the light emitting elements.

The second electrode may extend along the side surface of the light emitting elements to be formed on the light emitting elements.

The second electrode may include a light transmissive material.

The second electrode may be disposed between the first organic layer and the second organic layer.

According to an embodiment of the disclosure, a trap of an electron due to a defect portion in an insulating layer disposed on a surface of a light emitting element may be prevented to efficiently provide the electron to an active layer, thereby improving light emission efficiency of a display device.

However, the effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detail embodiments thereof with reference to the accompanying drawings.

DETAILED DESCRIPTION OF THE EMBODIMENT

Figure 1:
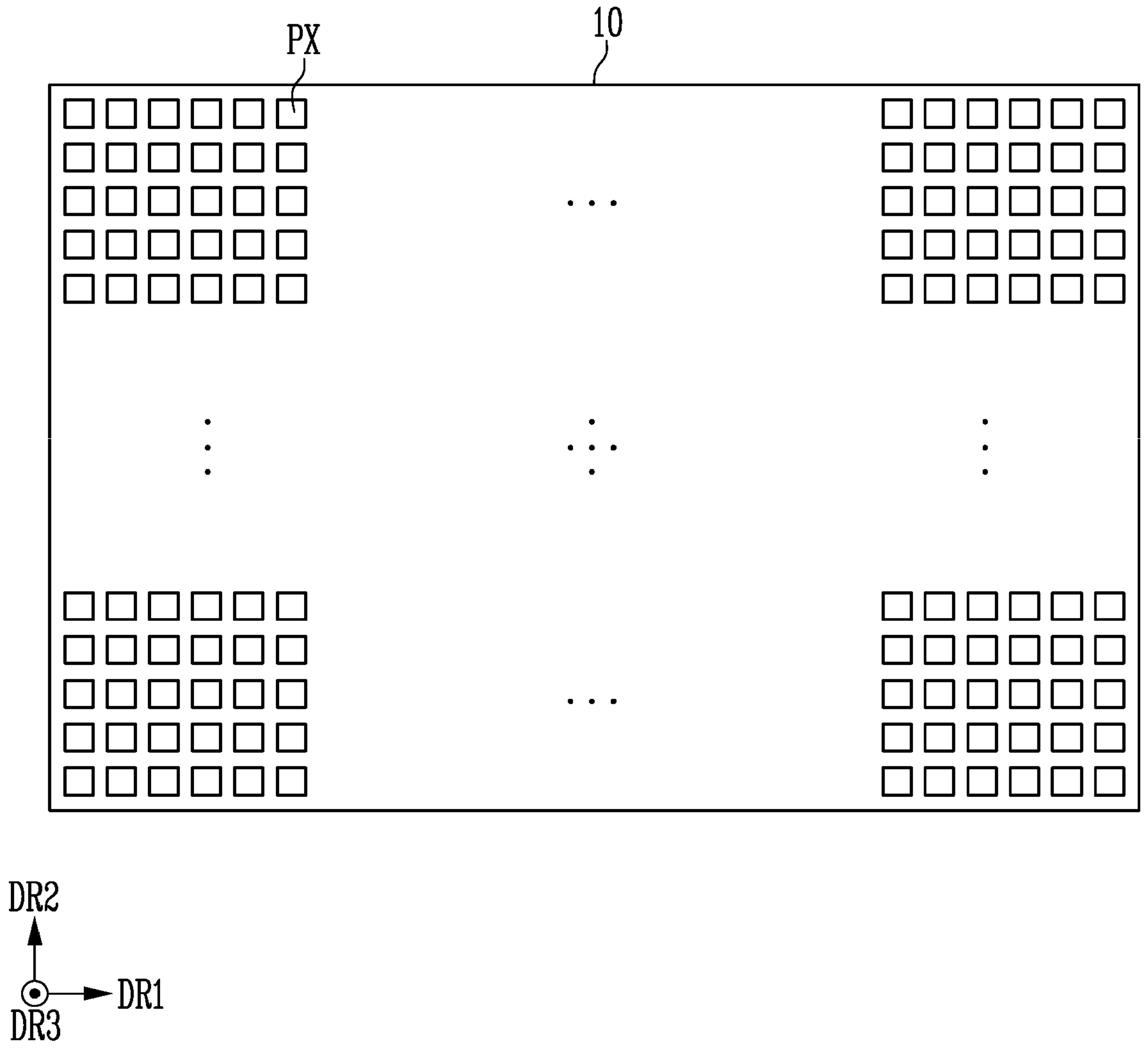
FIG. 1 is a schematic plan view illustrating a display device in accordance with an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments of the invention will be described in more detail with reference to the accompanying drawings.

FIG. 1 is a schematic plan view illustrating a display device according to an embodiment.

Referring to FIG. 1, the display device 10 may output light information. For example, the display device 10 may be a device for displaying a moving image or a still image, and may be applied to various devices. The display device 10 may be formed in a rectangular shape having a long side of a first direction DR1 and a short side of a second direction DR2 intersecting the first direction DR1. A corner where the long side of the first direction DR1 and the short side of the second direction DR2 meet may be formed to be rounded at a certain curvature or may be formed at a right angle. A shape of the display device 10 in a plan view is not limited to a quadrangle, and may be formed in another polygon, circle, or ellipse. The display device 10 may be formed to be flat, but embodiments are not limited thereto. For example, the display device 10 may include a curved portion formed at left and right end portions and having a constant curvature or a varying curvature. For example, the display device 10 may have flexibility to be crooked, curved, bent, folded, or rolled.

The display device 10 may further include pixels PX, scan lines extending in the first direction DR1, and data lines extending in the second direction DR2 to display an image. The pixels PX may be arranged in a matrix shape in the first direction DR1 and the second direction DR2.

Figure 2:
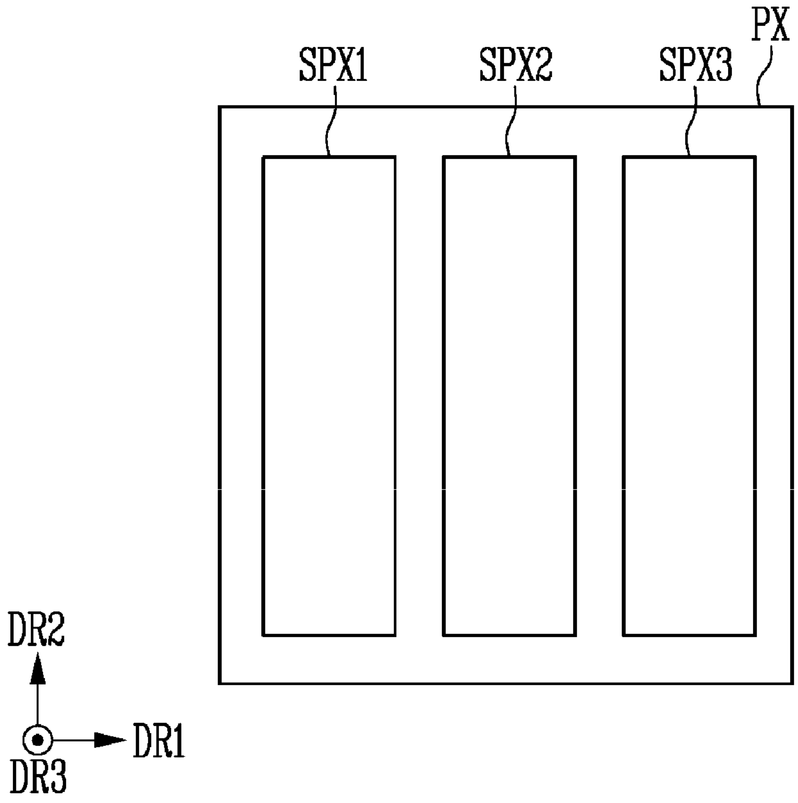
FIG. 2 is a schematic diagram illustrating an example of a pixel of FIG. 1.

FIG. 2 is a schematic diagram illustrating an example of the pixel of FIG. 1.

Referring to FIG. 2, each of the pixels PX may include sub-pixels SPX1, SPX2, and SPX3. FIG. 2 illustrates that each of the pixels PX includes three sub-pixels SPX1, SPX2 and SPX3, e.g., a first sub-pixel SPX1, a second sub-pixel SPX2, and a third sub-pixel SPX3, but embodiments are not limited thereto.

The first sub-pixel SPX1, the second sub-pixel SPX2, and the third sub-pixel SPX3 may be connected to any one data line among the data lines and at least one scan line among the scan lines.

Each of the first sub-pixel SPX1, the second sub-pixel SPX2, and the third sub-pixel SPX3 may have a shape of a rectangle, a square, or a rhombus, e.g., in a plan view. For example, each of the first sub-pixel SPX1, the second sub-pixel SPX2, and the third sub-pixel SPX3 may have a shape of a rectangle having a short side of the first direction DR1 and a long side of the second direction DR2, e.g., in a plan view. In another example, according to an embodiment, each of the first sub-pixel SPX1, the second sub-pixel SPX2, and the third sub-pixel SPX3 may have a shape of a square or a rhombus including sides having the same length in the first direction DR1 and the second direction DR2, e.g., in a plan view.

The first sub-pixel SPX1, the second sub-pixel SPX2, and the third sub-pixel SPX3 may be arranged in the first direction DR1. In another example, the first sub-pixel SPX1 and one of the second sub-pixel SPX2 and the third sub-pixel SPX3 may be arranged in the first direction DR1, and the first sub-pixel SPX1 and another one of the second sub-pixel SPX2 and the third sub-pixel SPX3 may also be arranged in the second direction DR2. In another example, the second sub-pixel SPX2 and one of the first sub-pixel SPX1 and the third sub-pixel SPX3 may be arranged in the first direction DR1, and the second sub-pixel SPX2 and another one of the first sub-pixel SPX1 and the third sub-pixel SPX3 may be arranged in the second direction DR2. In another example, the third sub-pixel SPX3 and one of the first sub-pixel SPX1 and the second sub-pixel SPX2 may be arranged in the first direction DR1, and the third sub-pixel SPX3 and another one of the first sub-pixel SPX1 and the second sub-pixel SPX2 may be arranged in the second direction DR2.

The first sub-pixel SPX1 may emit first light, the second sub-pixel SPX2 may emit second light, and the third sub-pixel SPX3 may emit third light. For example, the first light may be light of a red wavelength band, the second light may be light of a green wavelength band, and the third light may be light of a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but embodiments are not limited to the above-described example.

Each of the first sub-pixel SPX1, the second sub-pixel SPX2, and the third sub-pixel SPX3 may include an inorganic light emitting element including an inorganic semiconductor as a light emitting element LE (refer to FIG. 3) that emits light.

The area (or size) of the first sub-pixel SPX1, the area (or size) of the second sub-pixel SPX2, and the area (or size) of the third sub-pixel SPX3 may be substantially the same as each other, but embodiments are not limited thereto. At least one of the area of the first sub-pixel SPX1, the area of the second sub-pixel SPX2, and the area of the third sub-pixel SPX3 may be different from each other. In another example, any two of the area of the first sub-pixel SPX1, the area of the second sub-pixel SPX2, and the area of the third sub-pixel SPX3 may be substantially the same as each other, and may be different from the other one of the area of the first sub-pixel SPX1, the area of the second sub-pixel SPX2, and the area of the third sub-pixel SPX3. In another example, the area of the first sub-pixel SPX1, the area of the second sub-pixel SPX2, and the area of the third sub-pixel SPX3 may be different from each other.

Figure 3:
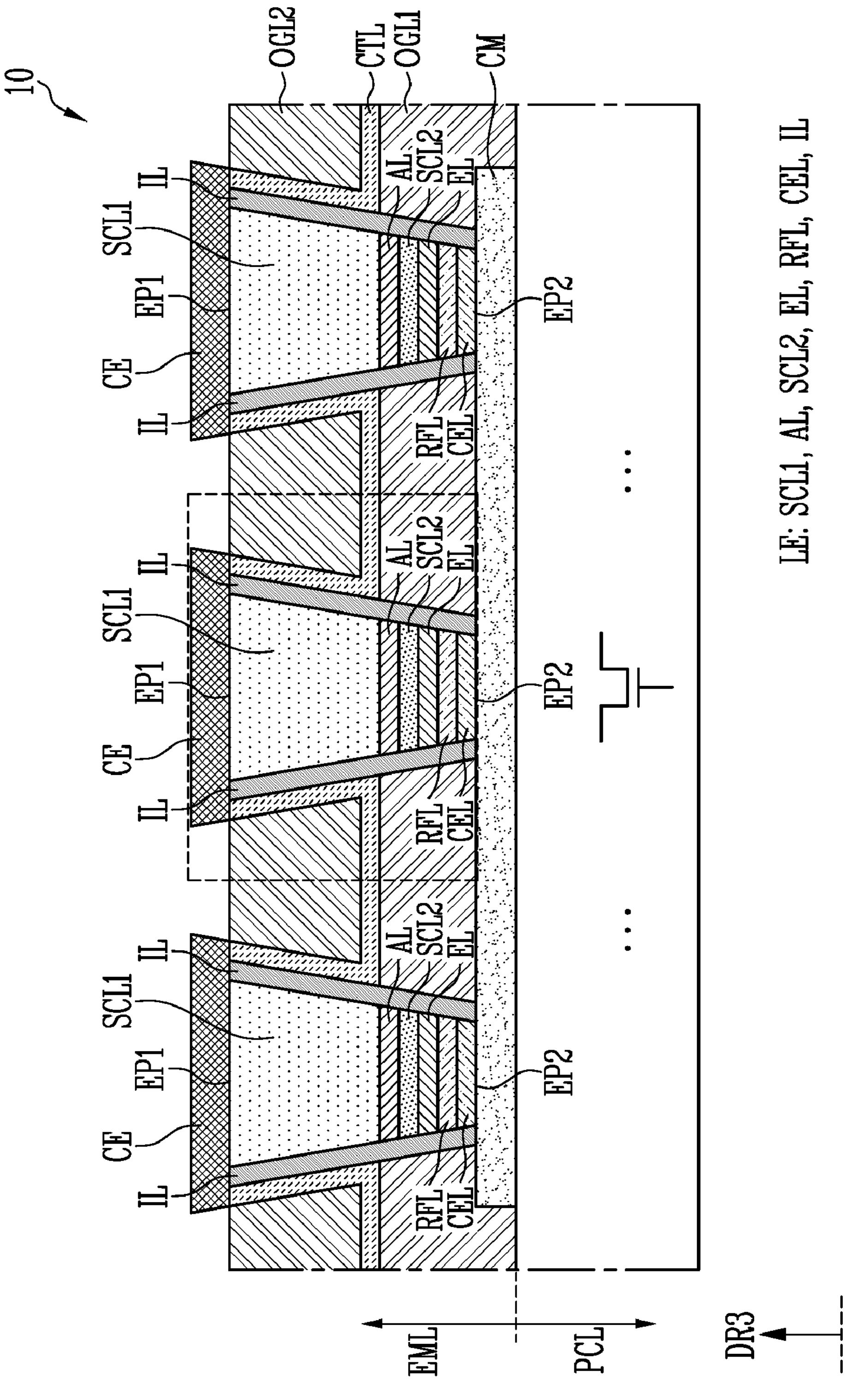
FIG. 3 is a schematic cross-sectional view illustrating a display device in accordance with an embodiment.

FIG. 3 is a schematic cross-sectional view illustrating a display device according to an embodiment.

Referring to FIG. 3, the display device 10 may include a pixel circuit layer PCL and a light emitting element layer EML.

The pixel circuit layer PCL may be a layer including a pixel circuit for driving the light emitting elements LE. The pixel circuit layer PCL may include a substrate (or a base layer), metal layers for forming a pixel circuit, and insulating layers disposed between the metal layers.

According to an embodiment, the substrate may be a base substrate or a base member for supporting the display device 10. The substrate may include a rigid substrate of a glass material. In another example, the substrate may be a flexible substrate that is bendable, foldable, rollable, and the like. For example, the substrate may include an insulating material of a polymer resin or the like such as polyimide.

According to an embodiment, the pixel circuit may include a thin film transistor. The pixel circuit may further include a storage capacitor. The pixel circuit may be electrically connected to the light emitting elements LE to provide an electrical signal for the light emitting elements LE to emit light.

The light emitting element layer EML may be disposed on the pixel circuit layer PCL. According to an embodiment, the light emitting element layer EML may include a first electrode CM, a second electrode CE, the light emitting elements LE, a first organic layer OGL1, a second organic layer OGL2, and a contact layer CTL.

The first electrode CM may be disposed on the pixel circuit layer PCL. The first electrode CM may be disposed under the light emitting elements LE and electrically connected to the light emitting elements LE. For example, the first electrode CM may be electrically connected to the light emitting elements LE through a second end portion EP2 adjacent to a connection electrode layer CEL of the light emitting elements LE.

The first electrode CM may be electrically connected to the pixel circuit (for example, a driving transistor and the like) formed in the pixel circuit layer PCL. The first electrode CM may receive the electrical signal (for example, a driving signal as an anode signal) for driving the light emitting elements LE.

The first electrode CM may be a bonding electrode. The light emitting elements LE may be bonded to the first electrode CM. For example, the light emitting elements LE may be transferred onto the first electrode CM by various transfer methods, and may be bonded to and electrically connected to the first electrode CM by a bonding method. As the bonding method, an anisotropic conductive film (AFC) bonding method, a laser assist bonding (LAB) method by using laser, an ultrasonic bonding method, a bump-ball surface mounted method by using a ball grid array (BGA), a pressure and heat bonding method by using a thermo-compression bonding (TCB), and the like may be used. The pressure and heat bonding method may include a method of electrically and physically connecting the light emitting element LE and the first electrode CM by applying pressure to the light emitting element LE and the first electrode CM after heating the light emitting element LE and the first electrode CM at a temperature higher than a melting point of the first electrode CM in a state that the light emitting elements LE and the first electrode CM are in contact with each other.

The second electrode CE may be disposed on the light emitting elements LE to be electrically connected to the light emitting elements LE. For example, the second electrode CE may be electrically connected to the light emitting elements LE through the first end portion EP1 adjacent to a first semiconductor layer SCL1 of the light emitting elements LE. The second electrode CE may be a cathode electrode and may receive a cathode signal. The second electrode CE may supply a voltage of a power line supplied through the contact layer CTL to the light emitting elements LE.

According to an embodiment, the first electrode CM may be a pixel electrode of the light emitting elements LE, and the second electrode CE may be a common electrode of the light emitting elements LE. The first electrode CM and the second electrode CE may be disposed to face each other with the light emitting elements LE interposed between the first electrode CM and the second electrode CE.

The first electrode CM may include a conductive material. For example, the first electrode CM may include at least one of a group of silver (Ag), magnesium (Mg), aluminum (Al), platinum (Pt), palladium (Pd), gold (Au), nickel (Ni), neodymium (Nd), iridium (Ir), chromium (Cr), and titanium (Ti). However, embodiments are not limited to the above-described example.

The second electrode CE may include a transmissive material (e.g., light transmissive material or transparent material). For example, the second electrode CE may include at least one of a group of a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). However, embodiments are not limited to the above-described example, and the second electrode CE may include a conductive material.

The light emitting elements LE may be disposed on the first electrode CM to be electrically connected to the first electrode CM. The light emitting elements LE may be provided to each of the sub-pixels SPX1, SPX2, and SPX3.

The light emitting element LE may emit light. The light emitting element LE may include the first semiconductor layer SCL1, a second semiconductor layer SCL2, and an active layer AL disposed between the first semiconductor layer SCL1 and the second semiconductor layer SCL2. According to an embodiment, the light emitting element LE may further include an electrode layer EL, a reflective layer RFL, the connection electrode layer CEL, and an insulating layer IL. The light emitting element LE may have various shapes. For example, the light emitting element LE may have a pillar shape extending in a direction. However, embodiments are not limited to the above-described example.

The light emitting element LE may have various sizes. For example, the light emitting element LE may have a micro scale to nano scale in size. The size of the light emitting element LE is not limited to a specific numerical range.

The light emitting element LE may have the first end portion EP1 and the second end portion EP2. The first semiconductor layer SCL1 may be adjacent to the first end portion EP1 of the light emitting element LE, and the second semiconductor layer SCL2 may be adjacent to the second end portion EP2. According to an embodiment, the connection electrode layer CEL may be adjacent to (or in contact with) the second end portion EP2.

The first semiconductor layer SCL1 may include a semiconductor of a first type. The first semiconductor layer SCL1 may be disposed on the active layer AL, and may include a semiconductor of a type different from a type of the second semiconductor layer SCL2. For example, the first semiconductor layer SCL1 may include an N-type semiconductor. For example, the first semiconductor layer SCL1 may include one or more selected from a group of InAlGaN, GaN, AlGaN, InGaN, AlN, and InN, and may include an N-type semiconductor doped with a first conductivity type dopant such as Si, Ge, and Sn. However, embodiments are not limited to the above-described example.

The active layer AL may be disposed between the first semiconductor layer SCL1 and the second semiconductor layer SCL2. The active layer AL may include a single-quantum well structure or a multi-quantum well structure. A position of the active layer AL is not limited to a specific example, and may be variously changed according to a type of the light emitting element LE.

A clad layer doped with a conductive dopant may be formed on a side and/or another side of the active layer AL. For example, the clad layer may include one or more of AlGaN and InAlGaN. However, embodiments are not limited to the above-described example.

The second semiconductor layer SCL2 may include a semiconductor of a second type. The second semiconductor layer SCL2 may be disposed on the active layer AL and may include a semiconductor of a type different from that of the first semiconductor layer SCL1. For example, the second semiconductor layer SCL2 may include a P-type semiconductor. For example, the second semiconductor layer SCL2 may include one or more selected from a group of InAlGaN, GaN, AlGaN, InGaN, AlN, and InN, and may include a P-type semiconductor doped with a second conductivity type dopant such as Ga, B, and Mg. However, embodiments are not limited to the above-described example.

In case that a voltage equal to or greater than a threshold voltage is applied to the first end portion EP1 and the second end portion EP2 of the light emitting element LE electrically connected to the first electrode CM and the second electrode CE, an electron-hole pair may be coupled to each other in the active layer AL, and the light emitting element LE may emit light. By controlling light emission of the light emitting element LE, the light emitting element LE may be used as a light source in various devices.

The electrode layer EL may be disposed on the second semiconductor layer SCL2. According to an embodiment, the electrode layer EL may include one or more of a group of chromium (Cr), titanium (Ti), aluminum (Al), gold (Au), nickel (Ni), and an oxide and an alloy thereof. However, embodiments are not limited to the above-described example.

The reflective layer RFL may be disposed on the electrode layer EL. The reflective layer RFL may reflect light emitted from the light emitting element LE to transmit the emitted light in a direction for displaying an image. The reflective layer RFL may include a reflective material (e.g., light reflective material) having a certain reflectance. According to an embodiment, the reflective layer RFL may include one or more of a group of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof, and may include a conductive oxide such as indium tin oxide (ITO), indium zinc oxide (IZO), zinc oxide (ZnO), indium gallium zinc oxide (IGZO), and indium tin zinc oxide (ITZO). However, embodiments are not limited to the above-described example.

The connection electrode layer CEL may be disposed on the reflective layer RFL. The connection electrode layer CEL may be electrically connected to the first electrode CM to apply a light emitting signal to the light emitting element LE. The connection electrode layer CEL may reduce a resistance between the light emitting element LE and the first electrode CM. The connection electrode layer CEL may include a eutectic metal. According to an embodiment, the connection electrode layer CEL may include an alloy of tin (Sn), silver (Ag), and copper (Cu) (SAC) or an alloy of gold (Au) and tin (Sn). However, embodiments are not limited to the above-described example.

The insulating layer IL may be disposed on a side surface of the light emitting element LE to surround the side surface of the active layer AL. According to an embodiment, the insulating layer IL may be disposed on the surface of the light emitting element LE to surround side surfaces of each of the first semiconductor layer SCL1, the second semiconductor layer SCL2, the electrode layer EL, the reflective layer RFL, and the connection electrode layer CEL. Accordingly, the insulating layer IL may prevent an electrical short circuit that occurs in case that the active layer AL contacts a conductive material other than the first semiconductor layer SCL1 and the second semiconductor layer SCL2. For example, the insulating layer IL may minimize a surface defect portion of the light emitting element LE to improve the lifespan of the light emitting element LE.

According to an embodiment, the light emitting element LE may further include a third semiconductor layer. The third semiconductor layer may be disposed on the first semiconductor layer SCL1. The third semiconductor layer may include an undoped semiconductor. The third semiconductor layer and the first semiconductor layer SCL1 may include the same material. The third semiconductor layer may include a material that is not doped with an N-type dopant or a P-type dopant. According to an embodiment, the third semiconductor layer may include one or more of undoped InAlGaN, GaN, AlGaN, InGaN, AlN, and InN groups. However, embodiments are not limited to the above-described example.

The first organic layer OGL1 may be disposed on the pixel circuit layer PCL and the first electrode CM, and may be disposed between the light emitting elements LE. The first organic layer OGL1 may be spaced apart from (or face) the active layer AL, the second semiconductor layer SCL2, the electrode layer EL, the reflective layer RFL, and the connection electrode layer CEL with the insulating layer IL interposed between the first organic layer OGL1 and the active layer AL, between the first organic layer OGL1 and the second semiconductor layer SCL2, between the first organic layer OGL1 and the electrode layer EL, the reflective layer RFL, and between the first organic layer OGL1 and the connection electrode layer CEL. The first organic layer OGL1 may be spaced apart from (or face) the second organic layer OGL2 with the contact layer CTL interposed between the first organic layer OGL1 and the second organic layer OGL2.

The first organic layer OGL1 may include an organic material that stably fixes the light emitting elements LE and reinforces adhesion between the light emitting elements LE and the first electrode CM. According to an embodiment, the first organic layer OGL1 may include one or more selected from a group consisting of acrylic resin (e.g., polyacrylates resin), epoxy resin, phenolic resin, polyamides resin, and polyimide resin. However, embodiments are not limited to the above-described example, and the first organic layer OGL1 may include an inorganic material.

The contact layer CTL may be disposed between the first organic layer OGL1 and the second organic layer OGL2 and may contact a side surface of the light emitting elements LE. The side surface of the light emitting elements LE may refer to a side surface of the insulating layer IL disposed on the side surface of the first semiconductor layer SCL1. The contact layer CTL may extend along the side surface of the light emitting elements LE. For example, the contact layer CTL may be spaced apart from (or face) the first semiconductor layer SCL1 with the insulating layer IL interposed between the contact layer CTL and the first semiconductor layer SCL1.

The contact layer CTL may extend along the side surface of the light emitting elements LE to contact the second electrode CE. The contact layer CTL may be electrically connected to the power line and may supply the voltage of the power line to the second electrode CE. For example, the contact layer CTL may be the cathode electrode and may receive the cathode signal.

The contact layer CTL may include a reflective material (e.g., light reflective material) having a certain reflectance. The contact layer CTL may reflect the light emitted from the light emitting element LE to transmit the emitted light in a direction for displaying an image. According to an embodiment, the contact layer CTL may include one or more of a group of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, embodiments are not limited to the above-described example, and the contact layer CTL may include a conductive material.

The second organic layer OGL2 may be disposed on the contact layer CTL and may be disposed between the light emitting elements LE. The second organic layer OGL2 may be spaced apart from (or face) the light emitting elements LE with the contact layer CTL interposed between the second organic layer OGL2 and the light emitting elements LE. The second organic layer OGL2 may be spaced apart from (or face) the first organic layer OGL1 with the contact layer CTL interposed between the first organic layer OGL1 and the second organic layer OGL2.

The second organic layer OGL2 may include an organic material stably fixing the light emitting elements LE and the contact layer CTL. According to an embodiment, the second organic layer OGL2 may include one or more selected from a group consisting of acrylic resin (e.g., polyacrylates resin), epoxy resin, phenolic resin, polyamides resin, and polyimides resin. However, embodiments are not limited to the above-described example, and the second organic layer OGL2 may include an inorganic material.

A stack structure of the display device 10 is not necessarily limited to the above-described example. According to an embodiment, the display device 10 may further include additional layers (for example, a color filter, an outer film, and the like).

Figure 4:
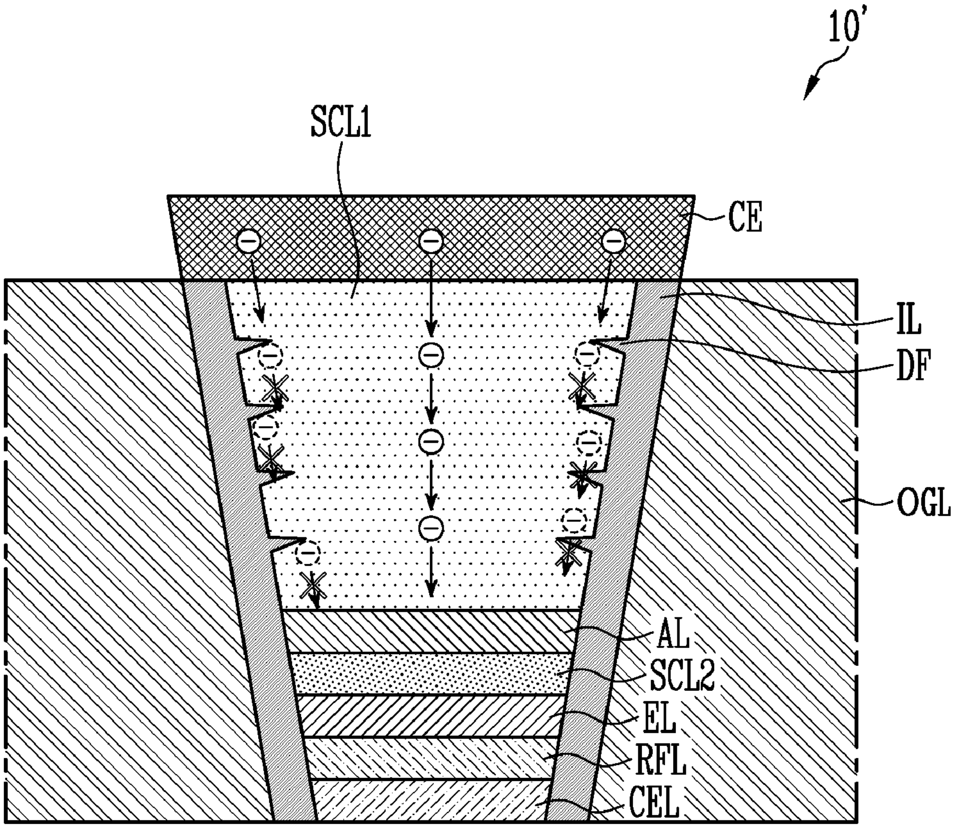
FIG. 4 is a schematic diagram illustrating an electron injection process according to a comparative example.
Figure 5:
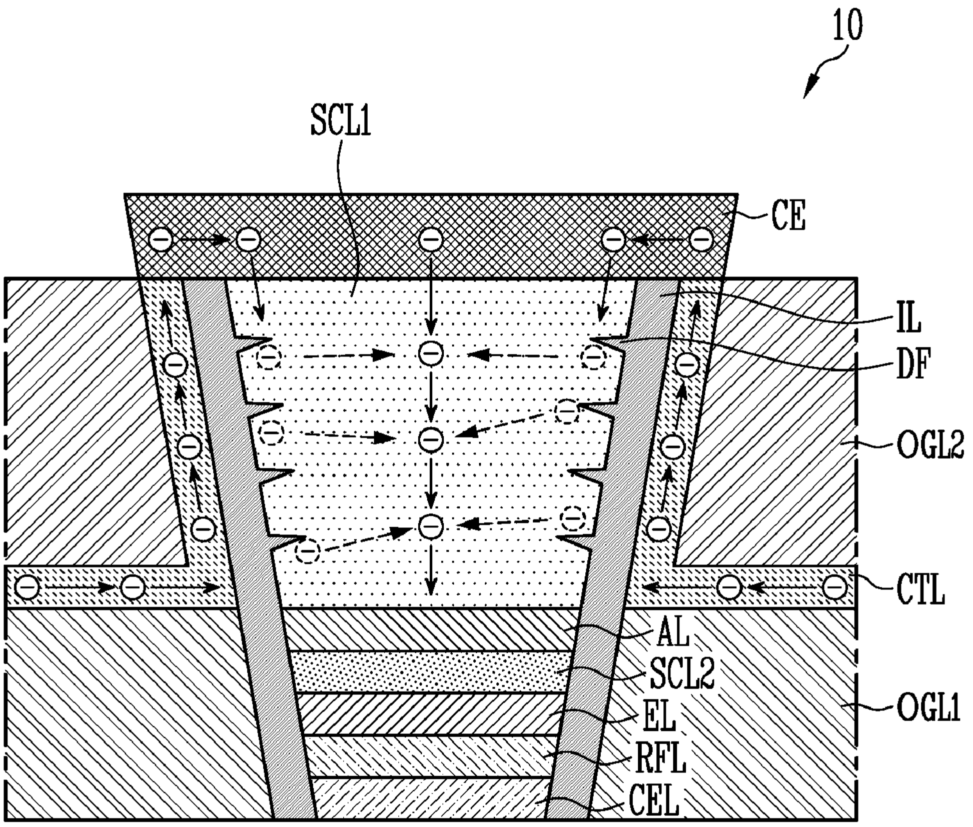
FIG. 5 is a schematic diagram illustrating an electron injection process in accordance with an embodiment.

FIG. 4 is a schematic diagram illustrating an electron injection process according to a comparative example, and FIG. 5 is a schematic diagram illustrating an electron injection process according to an embodiment. In FIG. 4, an area of a display device 10' is shown as an example, and in FIG. 5, a dotted line area of FIG. 3 is shown as an example.

Referring to FIGS. 4 and 5, differently from the display device 10 according to an embodiment, the display device 10' according to the comparative example may not include the contact layer CTL, and an organic layer (or a single organic layer) OGL may be disposed between the light emitting elements LE.

Referring to FIG. 4, electrons may be injected (or entered) into the active layer AL via the second electrode CE and the first semiconductor layer SCL1 connected to the power line. For example, the electrons may pass (or transfer) through the first semiconductor layer SCL1 occupying most of the light emitting elements LE in a process of being injected (or entered) into the active layer AL. For example, in case that a defect portion DF is formed in the insulating layer IL disposed on the side surface of the first semiconductor layer SCL1, some of the electrons passing (or transferring) through the first semiconductor layer SLC1 may be trapped by the defect portion DF of the insulating layer IL, and the number of electrons injected (or entered) into the active layer AL may be decreased, and thus light emission efficiency of the display device 10' may be decreased.

Referring to FIG. 5, the electrons may be injected (or entered) into the active layer AL via the contact layer CTL connected to the power line, the second electrode CE, and the first semiconductor layer SCL1. For example, the electrons may pass (or transfer) through the contact layer CTL extending along the side surface of the insulating layer IL disposed on the side surface of the first semiconductor layer SCL1. Thus, although the electrons TE are trapped on the side surface of the first semiconductor layer SCL1 due to the defect portion DF of the insulating layer IL, the trapped electrons TE may escape from the defect portion DF by repulsive force, which is generated between the trapped electrons and the electrons passing (or transferring) through the contact layer CTL, and may be injected (or entered) into the active layer AL. As described above, the contact layer CTL may increase supply of the electrons from the first semiconductor layer SCL1 to the active layer AL, thereby improving light emission efficiency of the display device 10.

FIGS. 6 to 11 are schematic diagrams illustrating a method of manufacturing a display device according to an embodiment.

Figure 6:
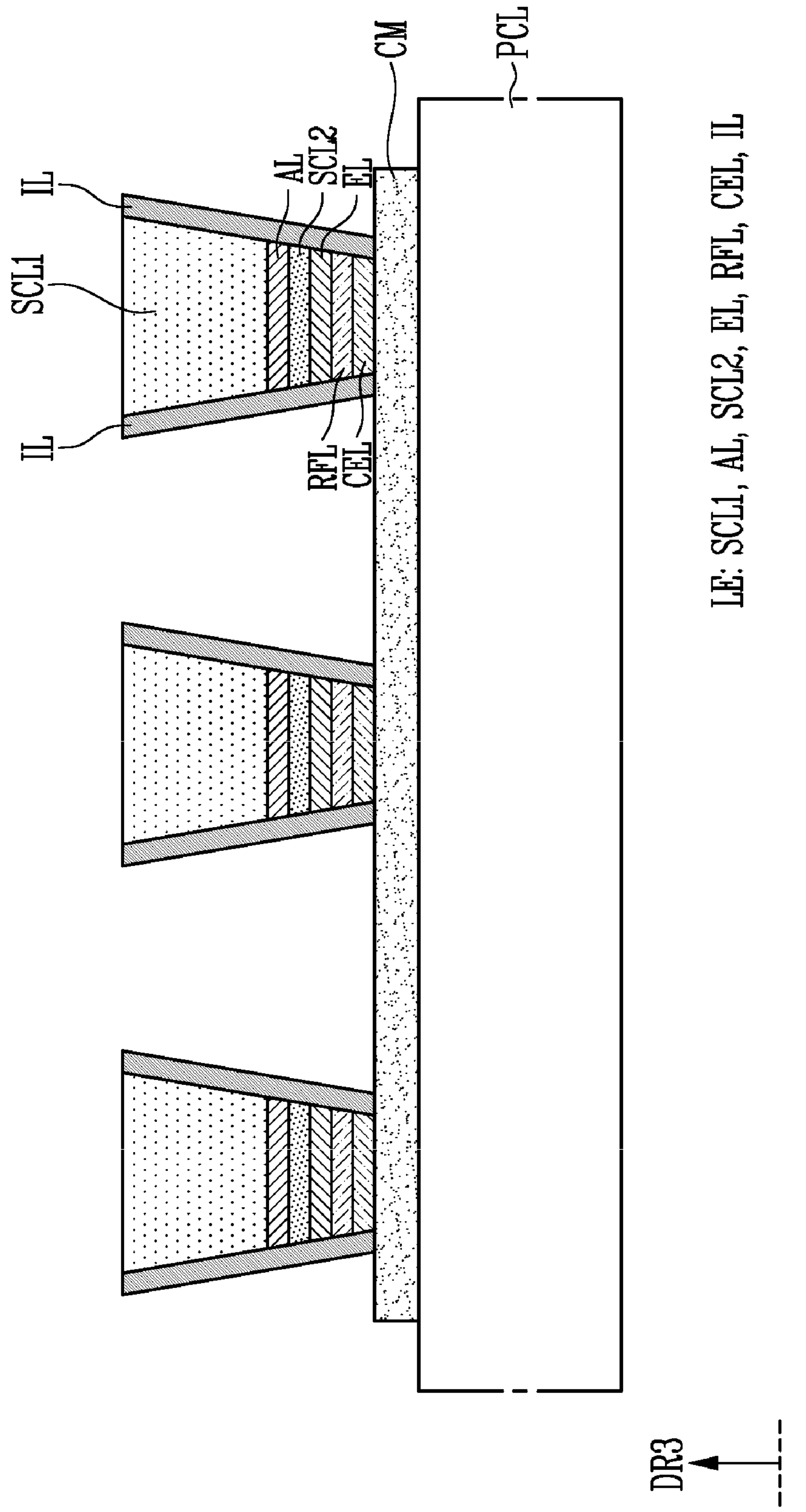
FIGS. 6, 7, 8, 9, 10 and 11 are schematic diagrams illustrating a method of manufacturing a display device in accordance with an embodiment.

Referring to FIG. 6, the light emitting elements LE may be transferred onto the first electrode CM on the pixel circuit layer PCL. For example, the light emitting elements LE may be attached to a transfer device and may be moved to be provided on the first electrode CM. For example, the light emitting elements LE may be attached to and electrically connected to the first electrode CM according to a heat bonding method.

Figure 7:
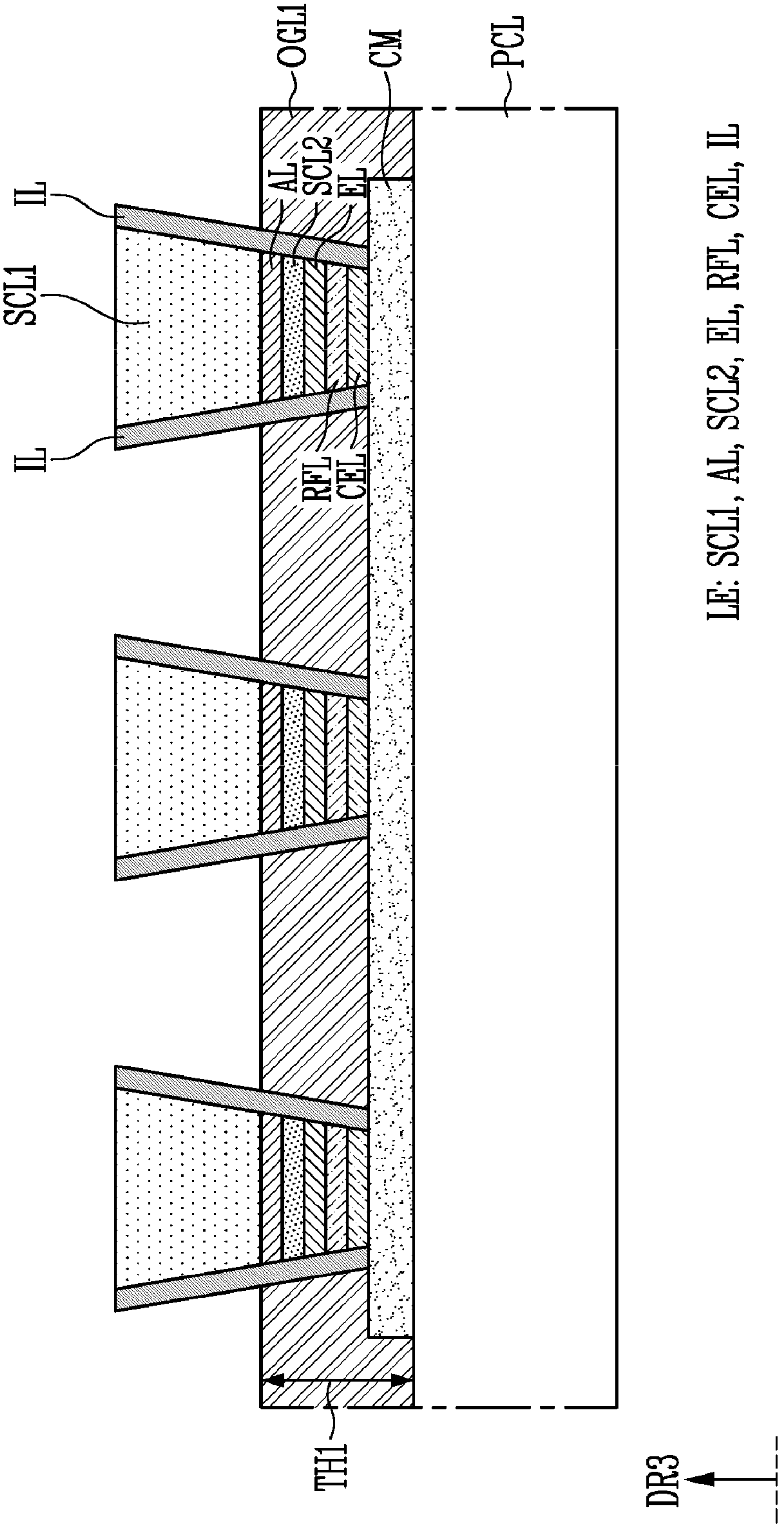

Referring to FIG. 7, the first organic layer OGL1 may be formed on the pixel circuit layer PCL and the first electrode CM. Accordingly, the first organic layer OGL1 may be formed between the light emitting elements LE. According to an embodiment, the first organic layer OGL1 may have a thickness TH1 to cover the side surface of the active layer AL. For example, the first organic layer OGL1 may cover side surfaces of the connection electrode layer CEL, the reflective layer RFL, the electrode layer EL, the second semiconductor layer SCL2, and the active layer AL.

Figure 8:
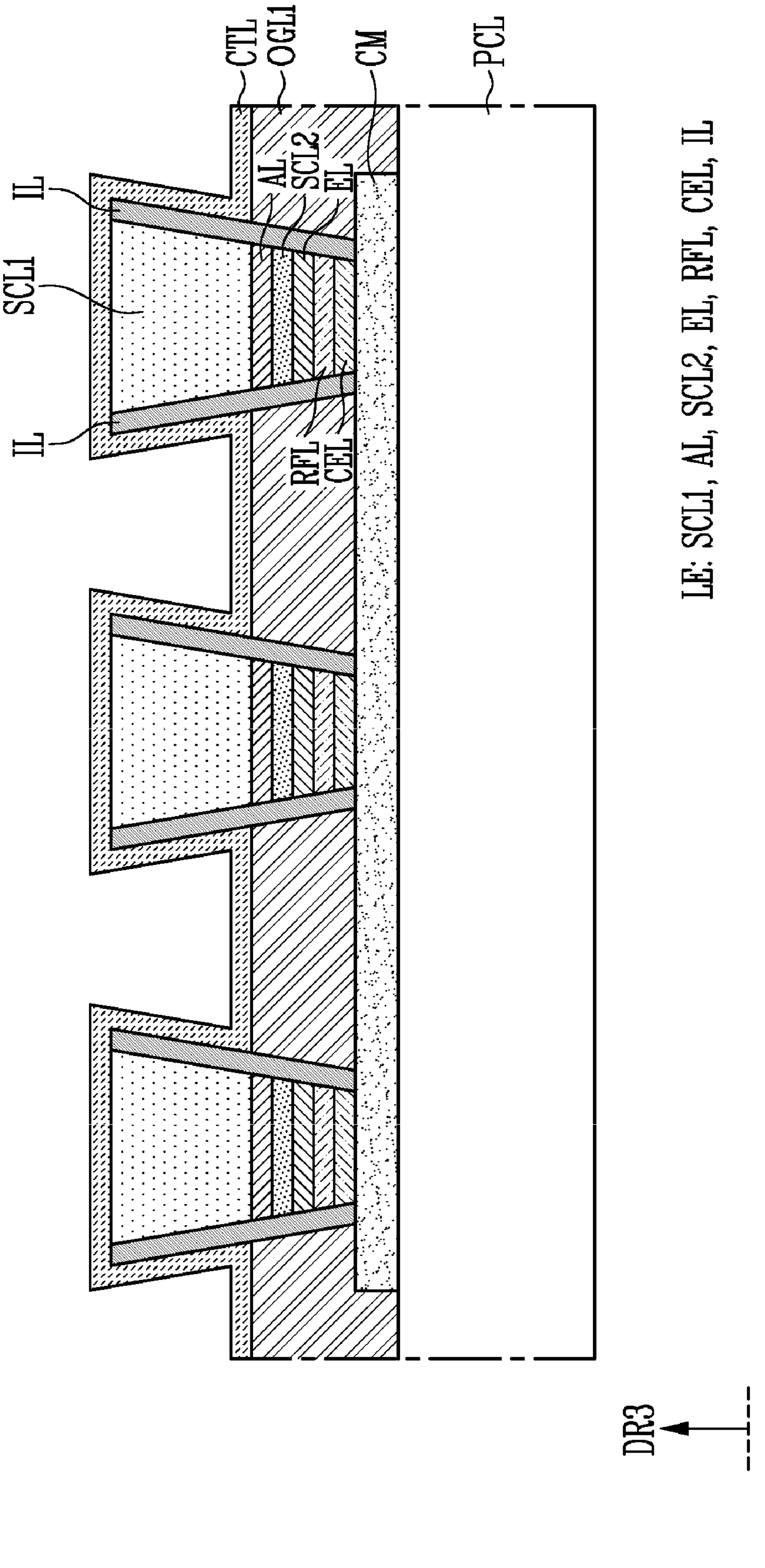

Referring to FIG. 8, the contact layer CTL may be formed on the first organic layer OGL1. For example, the contact layer CTL may be patterned to extend along the side surface of the light emitting elements LE through an etching process. However, embodiments are not limited to the above-described example, and the contact layer CTL may be patterned in various patterns.

Figure 9:
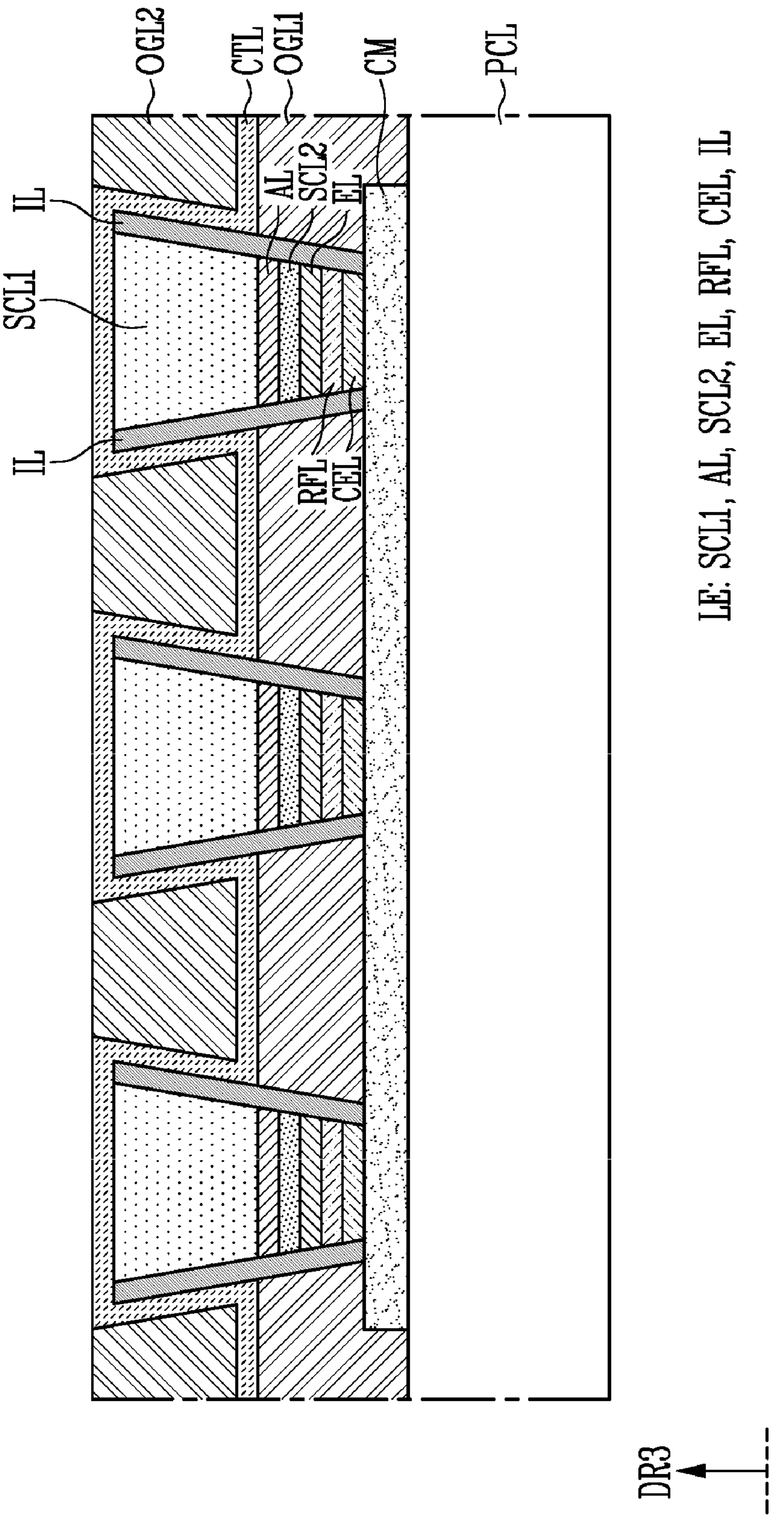

Referring to FIG. 9, the second organic layer OGL2 may be formed on the contact layer CTL. Accordingly, the second organic layer OGL2 may be disposed between the light emitting elements LE, and may be spaced apart from (or face) the light emitting elements LE with the contact layer CTL interposed between the second organic layer OGL2 and the light emitting elements LE.

Figure 10:
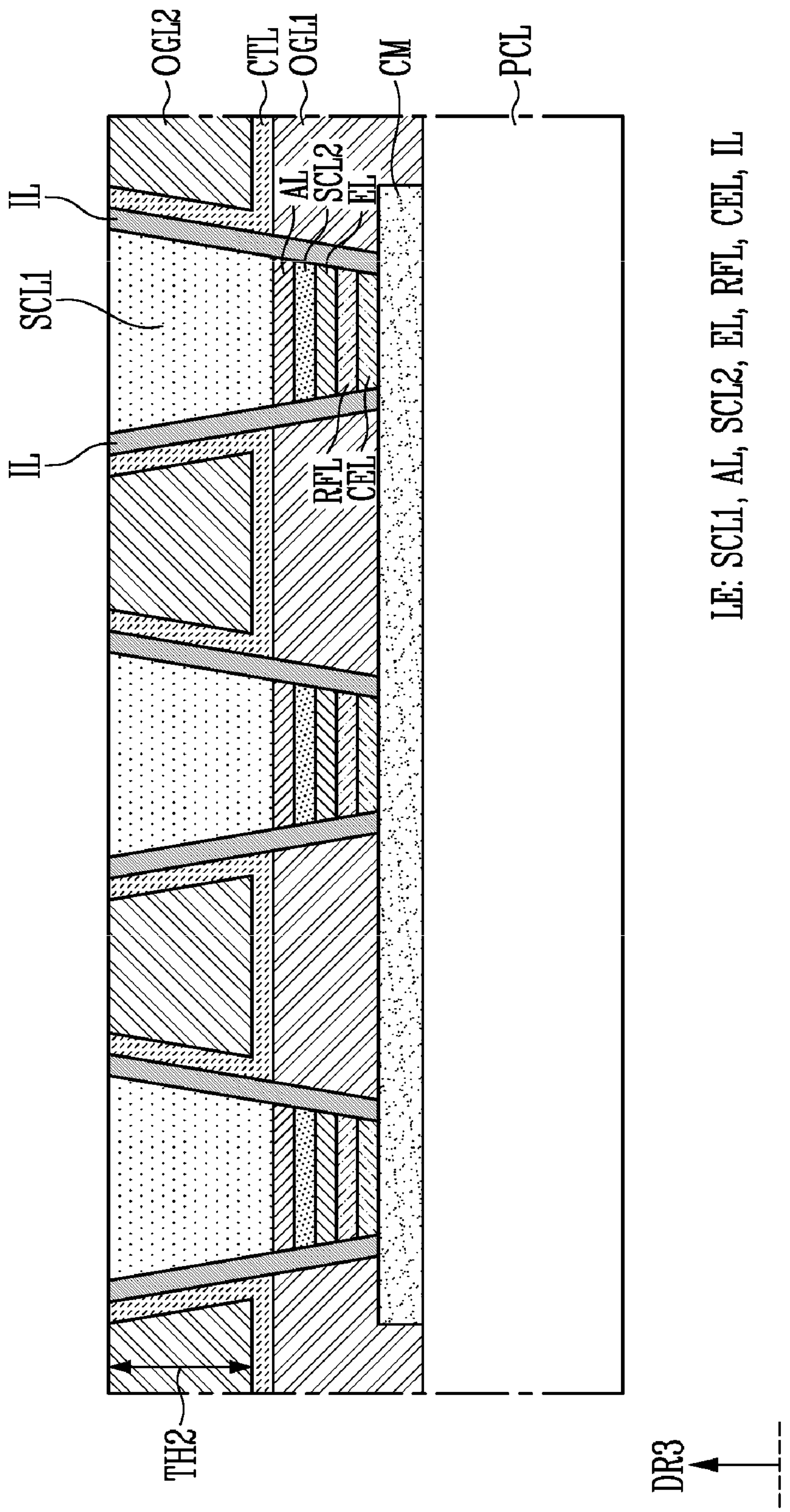

Referring to FIG. 10, the contact layer CTL and the second organic layer OGL2 may be etched. For example, an upper surface of the contact layer CTL and the second organic layer OGL2 may be etched to expose an upper surface of the light emitting elements LE. According to an embodiment, the second organic layer OGL2 may have a thickness TH2 to cover the side surface of the first semiconductor layer SCL1. For example, the second organic layer OGL2 may be formed at a position higher than that of the active layer AL.

Figure 11:
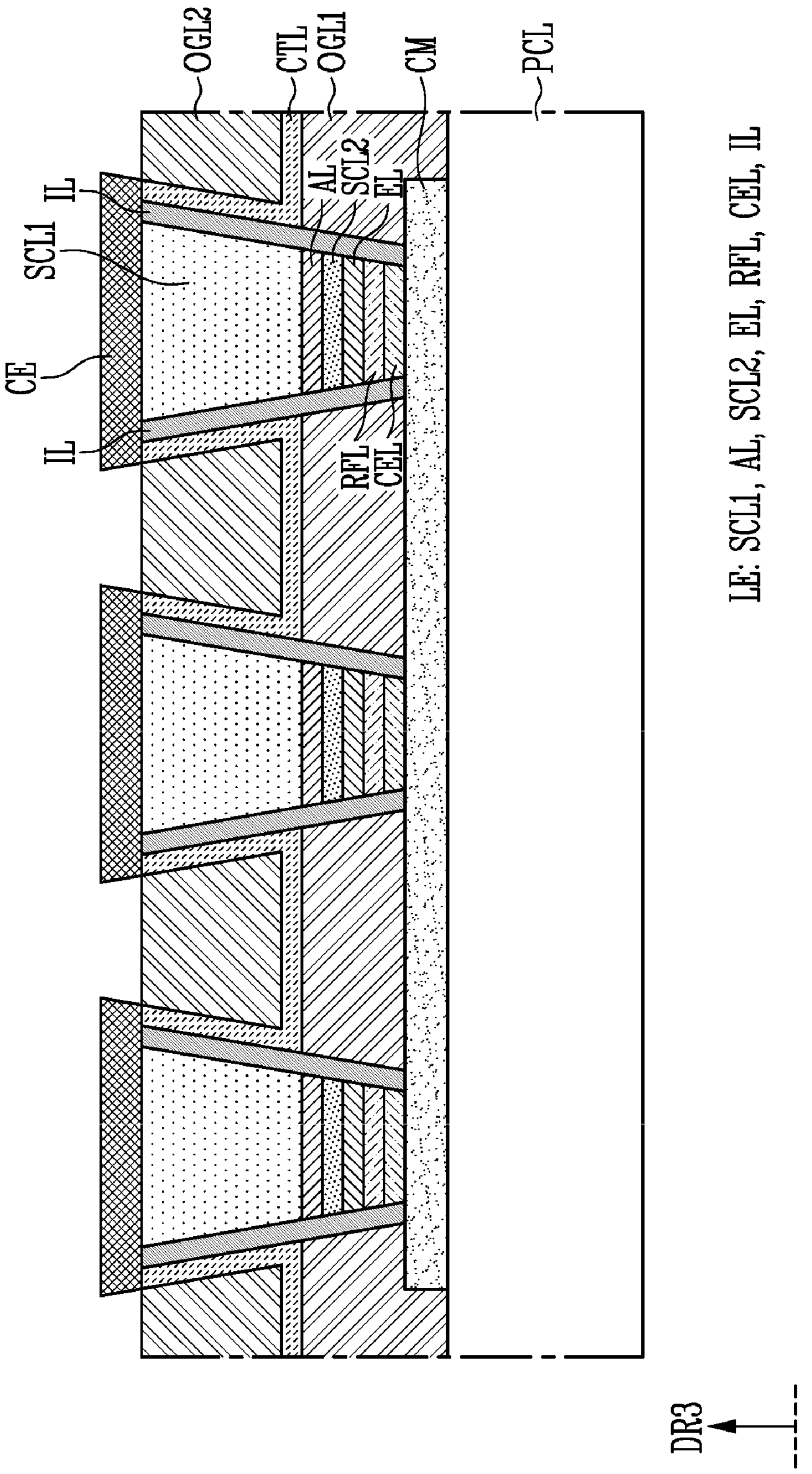

Referring to FIG. 11, second electrodes CE may be formed on the light emitting elements LE. According to an embodiment, the second electrode CE may be formed to cover the upper surface of the light emitting elements LE and to contact the contact layer CTL.

Figure 12:
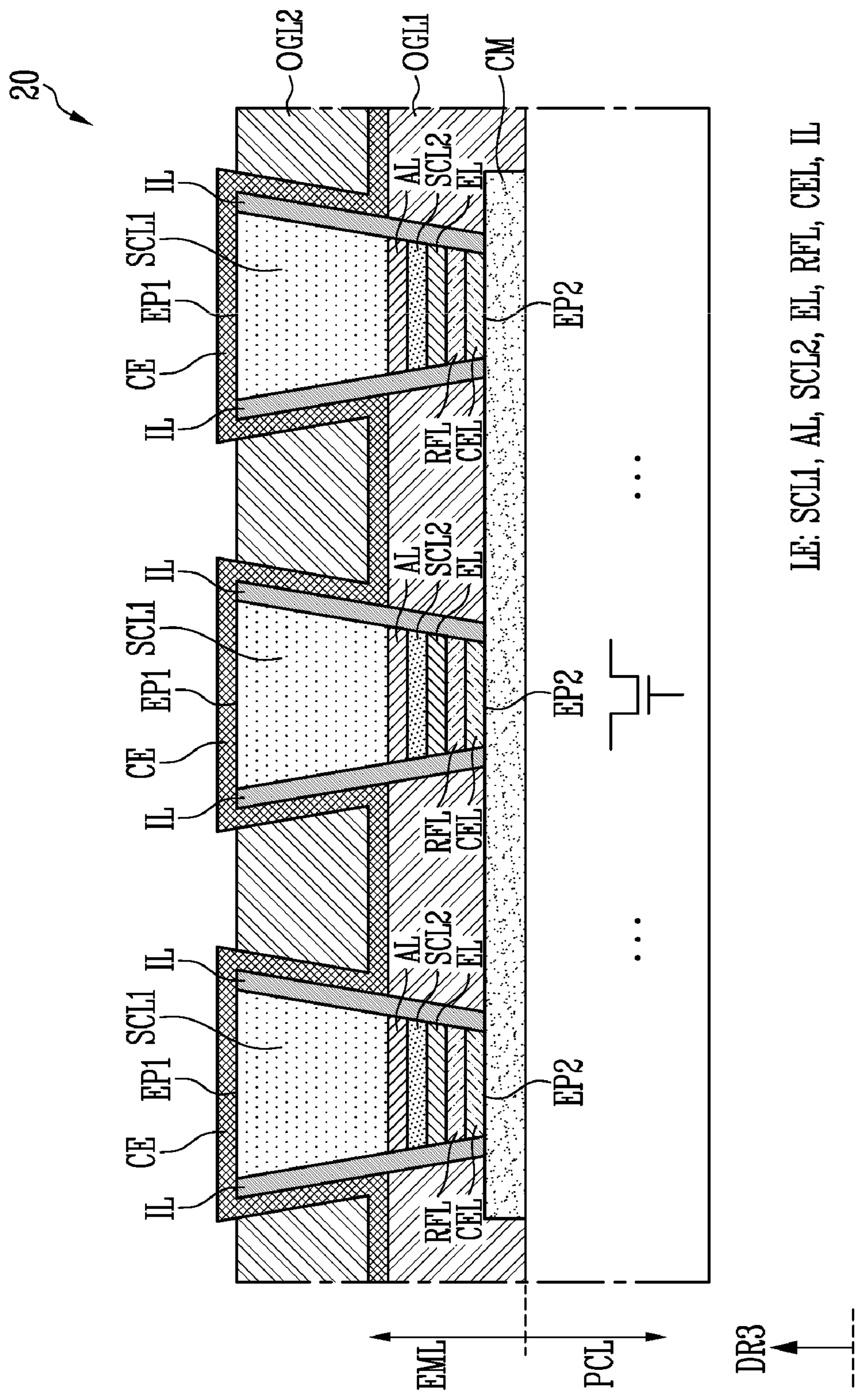
FIG. 12 is a schematic cross-sectional view illustrating a display device in accordance with an embodiment.

FIG. 12 is a schematic cross-sectional view illustrating a display device according to an embodiment. In relation to FIG. 12, a description of a content overlapping the above-described content is simplified or omitted.

Referring to FIG. 12, the display device 20 may include the first organic layer OGL1 spaced apart from (or facing) the second organic layer OGL2 with the second electrode CE interposed between the first organic layer OGL1 and the second organic layer OGL2. For example, the display device 20 may include the second organic layer OGL2 spaced apart from (or facing) the first organic layer OGL1 with the second electrode CE interposed between the first organic layer OGL1 and the second organic layer OGL2.

The display device 20 may be disposed on the light emitting elements LE to be electrically connected to the light emitting elements LE, and may include the second electrode CE disposed between the first organic layer OGL1 and the second organic layer OGL2. For example, the second electrode CE may be electrically connected to the light emitting elements LE through the first end portion EP1 adjacent to the first semiconductor layer SCL1 of the light emitting elements LE. For example, the second electrode CE may be disposed between the first organic layer OGL1 and the second organic layer OGL2 to contact the side surface of the light emitting elements LE. The second electrode CE may extend along the side surface of the light emitting elements LE and may be spaced apart from (or face) the first semiconductor layer SCL1 with the insulating layer IL interposed between the second electrode CE and the first semiconductor layer SCL1.

The second electrode CE may be electrically connected to the power line to supply the voltage of the power line to the light emitting elements LE. For example, the electrons may be injected (or entered) into the active layer AL via the second electrode CE and the first semiconductor layer SCL1 disposed on the side surface of the light emitting elements LE. For example, the electrons may pass (or transfer) through the second electrode CE extending along the side surface of the insulating layer IL disposed on the side surface of the first semiconductor layer SCL1. Thus, although the electrons are trapped on the side surface of the first semiconductor layer SCL1 due to a defect portion of the insulating layer IL, the trapped electrons may escape from the defect portion in the insulating layer IL by repulsive force, which is generated between the trapped electrons and the electrons passing (or transferring) through the second electrode CE, and may be injected (or entered) into the active layer AL. As described above, the second electrode CE disposed on the side of the light emitting elements LE may increase the supply of the electrons from the first semiconductor layer SCL1 to the active layer AL, thereby improving light emission efficiency of the display device 20.

Figure 13:
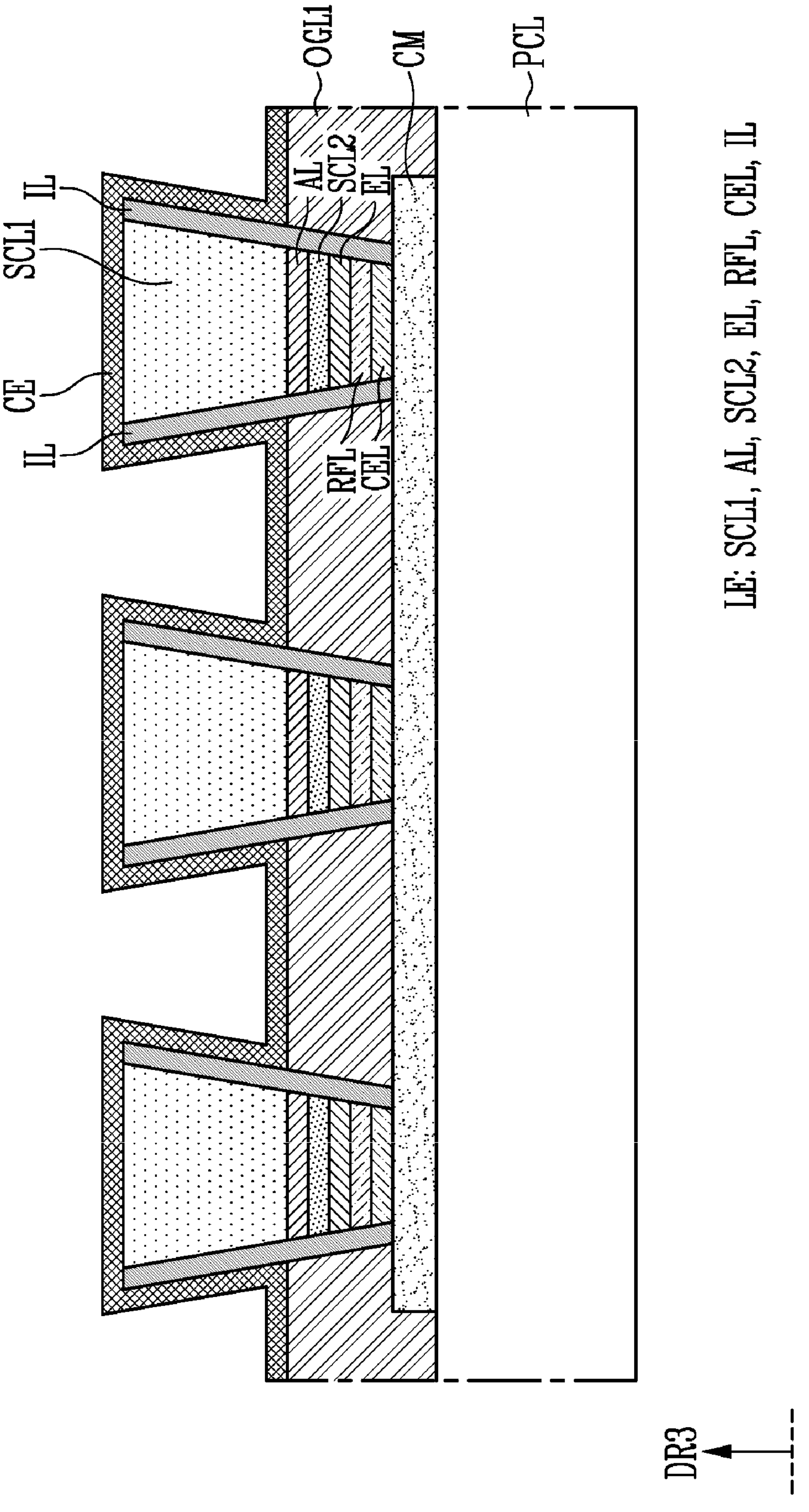
FIGS. 13 and 14 are schematic diagrams illustrating a method of manufacturing a display device according to an embodiment.
Figure 14:
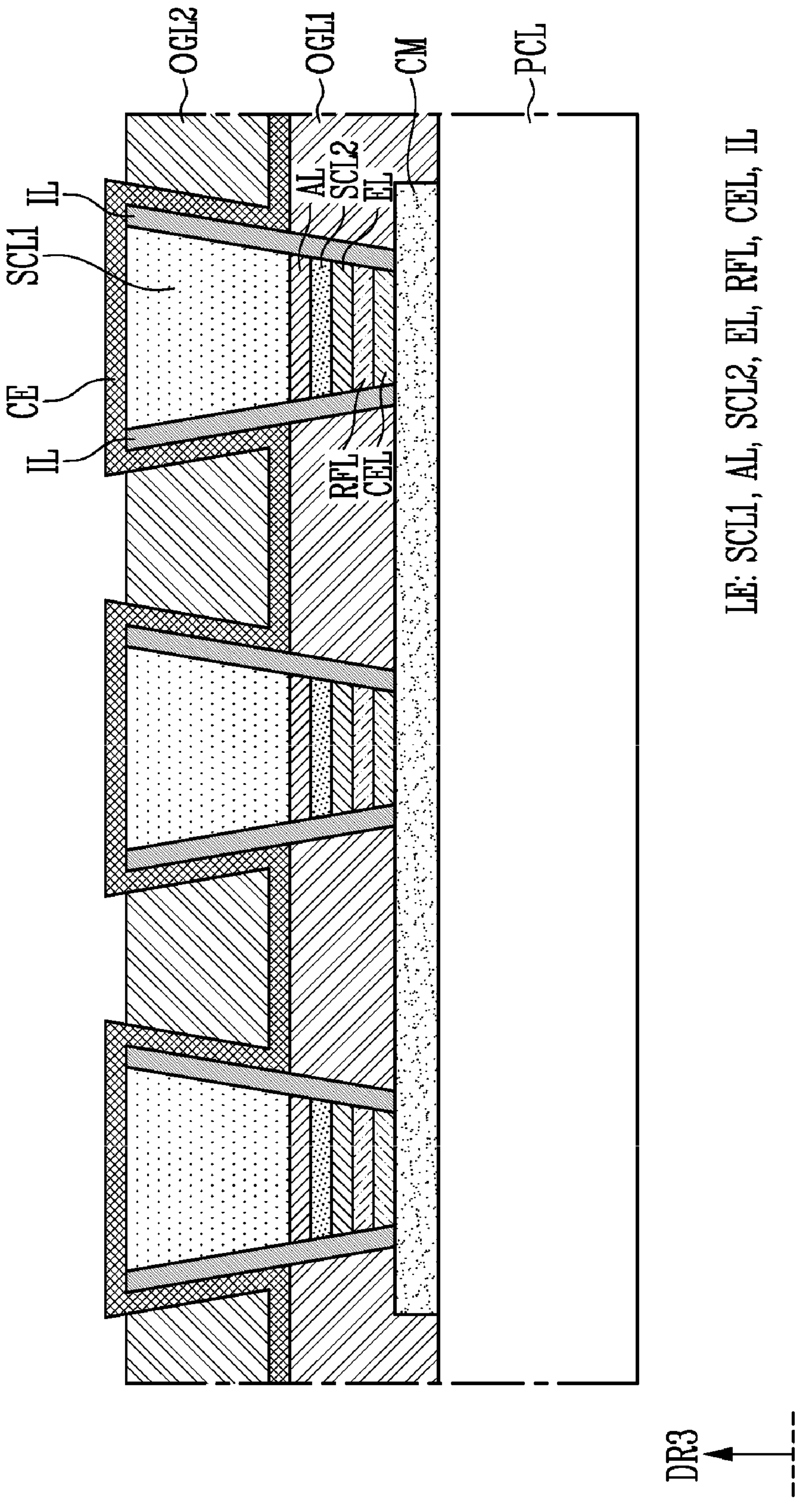

FIGS. 13 and 14 are schematic diagrams illustrating a method of manufacturing a display device according to an embodiment. In relation to FIGS. 13 and 14, a description of a content, which is similar to or the same as the above-described content is simplified or omitted for descriptive convenience.

The manufacturing steps of FIGS. 13 and 14 is similar to or the same as the manufacturing steps of FIGS. 6 and 7.

Referring to FIG. 13, the second electrode CE may be formed on the first organic layer OGL1. For example, the second electrode CE may be patterned to extend along the side surface of the light emitting elements LE by an etching process. However, embodiments are not limited to the above-described example, and the second electrode CE may be patterned in various patterns.

Referring to FIG. 14, the second organic layer OGL2 may be formed on the second electrode CE. For example, the second organic layer OGL2 may be patterned on the second electrode CE by an etching process. Accordingly, the second organic layer OGL2 may be disposed between the light emitting elements LE, and may be spaced apart from (or face) the light emitting elements LE with the second electrode CE interposed between the second organic layer OGL2 and the light emitting elements LE.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:

a pixel circuit layer including a base layer and a pixel circuit;

a first electrode disposed on the pixel circuit layer;

light emitting elements disposed on the first electrode;

a second electrode disposed on the light emitting elements;

a first organic layer disposed between the light emitting elements;

a second organic layer disposed between the light emitting elements and spaced apart from the light emitting elements; and a contact layer disposed between the first organic layer and the second organic layer and contacting a side surface of the light emitting elements, wherein a connection electrode layer disposed on a reflective layer and contacting the first electrode; and an insulating layer covering a side surface of a first semiconductor layer within the light emitting elements.

2. The display device of claim 1, wherein the contact layer extends along the side surface of the light emitting elements to contact the second electrode.

3. The display device of claim 1, wherein the second electrode includes a light transmissive material, and the contact layer includes a light reflective material.

4. The display device of claim 1, wherein each of the light emitting elements comprises:

the first semiconductor layer including a semiconductor of a first type;

a second semiconductor layer including a semiconductor of a second type different from the first type;

an active layer disposed between the first semiconductor layer and the second semiconductor layer;

an electrode layer disposed on the second semiconductor layer;

the reflective layer disposed on the electrode layer.

5. The display device of claim 4, wherein the first organic layer has a thickness to cover a side surface of the active layer.

6. The display device of claim 4, wherein the second organic layer has a thickness to cover the side surface of the first semiconductor layer.

7. A display device comprising:

a pixel circuit layer including a base layer and a pixel circuit;

a first electrode disposed on the pixel circuit layer;

light emitting elements disposed on the first electrode;

a first organic layer disposed between the light emitting elements;

a second organic layer disposed between the light emitting elements and spaced apart from the light emitting elements; and a second electrode disposed on the light emitting elements, disposed between the first organic layer and the second organic layer, and contacting a side surface of the light emitting elements, wherein a connection electrode layer disposed on a reflective layer and contacting the first electrode; and an insulating layer covering a side surface of a first semiconductor layer within the light emitting elements.

8. The display device of claim 7, wherein the second electrode extends along the side surface of the light emitting elements.

9. The display device of claim 7, wherein the second electrode includes a light transmissive material.

* * * * *